United States Patent
Ma

(10) Patent No.: US 9,876,035 B2
(45) Date of Patent: Jan. 23, 2018

(54) TFT SUBSTRATE INCLUDING ADDITIONAL METAL LAYER FOR REDUCING ELECTRICAL RESISTANCE AND MANUFACTURING METHOD THEREOF

(71) Applicant: Wuhan China Star Optoelectronics Technology Co., Ltd., Wuhan (CN)

(72) Inventor: Liang Ma, Wuhan (CN)

(73) Assignee: WUHAN CHINA STAR OPROELECTRONICS TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 15/221,614

(22) Filed: Jul. 28, 2016

(65) Prior Publication Data
US 2017/0352685 A1    Dec. 7, 2017

(30) Foreign Application Priority Data
Jun. 2, 2016   (CN) .......................... 2016 1 0387619

(51) Int. Cl.
*H01L 27/12*   (2006.01)
*G02F 1/1368*  (2006.01)
*G02F 1/1362*  (2006.01)

(52) U.S. Cl.
CPC .......... *H01L 27/124* (2013.01); *G02F 1/1368* (2013.01); *G02F 1/136204* (2013.01); *H01L 27/1262* (2013.01)

(58) Field of Classification Search
CPC ............... H01L 27/124; H01L 27/1262; G02F 1/136204; G02F 1/1368
See application file for complete search history.

(56) References Cited

U.S. PATENT DOCUMENTS

| | | | |
|---|---|---|---|
| 2010/0095031 A1* | 4/2010 | Shen ....................... | G06F 3/023 710/69 |
| 2010/0177256 A1* | 7/2010 | Park ....................... | G02F 1/1368 349/42 |
| 2015/0194443 A1* | 7/2015 | Chen .................. | H01L 29/78645 257/72 |
| 2015/0294987 A1* | 10/2015 | Xia ........................ | H01L 27/124 257/72 |
| 2016/0013436 A1* | 1/2016 | Im ....................... | H01L 51/5206 257/40 |

\* cited by examiner

*Primary Examiner* — Bilkis Jahan
(74) *Attorney, Agent, or Firm* — Leong C. Lei

(57) ABSTRACT

A TFT substrate and a manufacturing method thereof are provided. The TFT substrate includes a plurality of vias formed in a second insulation layer that is formed on a second metal layer that forms peripheral signal wiring traces of the TFT substrate so as to line up in an extension direction of each of the peripheral signal wiring traces and a third metal layer that is formed on the second insulation layer at a location corresponding to each of the peripheral signal wiring traces such that the third metal layer is connected, through the vias, with each of the peripheral signal wiring traces to thereby reduce the electrical resistance of each of the peripheral signal wiring traces and thus lowering down power consumption of control ICs and improving capability of the TFT substrate for resisting electrostatic discharge.

4 Claims, 3 Drawing Sheets

TFT SUBSTRATE INCLUDING ADDITIONAL METAL LAYER FOR REDUCING ELECTRICAL RESISTANCE AND MANUFACTURING METHOD THEREOF

BACKGROUND OF THE INVENTION

1. Field of the Invention

The present invention relates to the field of liquid crystal display technology, and in particular to a thin-film transistor (TFT) substrate and a manufacturing method thereof.

2. The Related Arts

Liquid crystal displays (LCDs) have a variety of advantages, such as thin device body, low power consumption, and being free of radiation, and thus have wide applications, such as liquid crystal televisions, mobile phones, personal digital assistants (PDAs), digital cameras, computer monitors, and notebook computer screens, making them in a leading position in the field of flat panel displays.

Most of the LCDs that are currently available in the market are backlighting LCDs, which comprise a liquid crystal display panel and a backlight module. The working principle of the liquid crystal display panel is that liquid crystal molecules are filled between a thin-film transistor (TFT) array substrate and a color filter (CF) substrate and a drive voltage is applied to the two substrates to control a rotation direction of the liquid crystal molecules in order to refract out light emitting from the backlight module to generate an image.

In an active liquid crystal display, each pixel is electrically connected to a TFT, wherein the TFT comprises a gate that is connected to a horizontal scan line, a drain that is connected to a data line arranged in a vertical direction, and a source connected to a pixel electrode. Application of a sufficient voltage to the horizontal scan line would turn on all TFTs that are electrically connected to horizontal scan line, allowing a signal voltage on the data line to write into the pixel. An effect of controlling color and brightness can be achieved by controlling light transmission of various liquid crystal. Gate driver on array (GOA) technology uses an array formation process adopted in the existing thin-film transistor liquid crystal display to make a gate row scan driving circuit on the TFT substrate for realizing a driving process of row-by-row scanning of the gates. The GOA technology may reduces bonding operations for external integrated circuits (ICs), allowing for increasing yield and lowering product cost, and also making it possible to allow the liquid crystal display panel suitable for making slim-bezel or bezel-free display products.

Currently, with the continuous progress of LCDs, a major direction of current development is high PPI (pixels per inch), being thin and light-weighted, and low power consumption. In the state of the art, to increase PPI of a liquid crystal display panel, the stages of GOA circuit arranged inside the liquid crystal display panel must be increased and this increases the product cost. To make a liquid crystal display panel light-weighted and think, the distance of glass cutting edge within the wire laying zone on the periphery of the panel must be reduced, thereby lowering down the capability of the peripheral wiring for resisting electrostatic discharge (ESD) so as to make the product poor and the quality reduced.

SUMMARY OF THE INVENTION

An object of the present invention is to provide a thin-film transistor (TFT) substrate, which helps lower resistance of peripheral signal wiring of the TFT substrate, reducing power consumption of control ICs, and improving capability of the TFT substrate for resisting electrostatic discharge.

Another object of the present invention is to provide a manufacturing method of a TFT substrate, which lowers resistance of peripheral signal wiring of the TFT substrate, reduces power consumption of control ICs, and improves capability of the TFT substrate for resisting electrostatic discharge.

To achieve the above objects, the present invention provides a TFT substrate, which comprises: a backing plate, a first insulation layer arranged on the backing plate, a second metal layer arranged on the first insulation layer, a second insulation layer set on and covering the second metal layer and the first insulation layer, a third metal layer arranged on the second insulation layer, and a third insulation layer set on and covering the third metal layer and the second insulation layer;

wherein the second metal layer comprises a plurality of peripheral signal wiring traces; the second insulation layer comprises, at locations above and corresponding to each of the peripheral signal wiring traces, a plurality of vias arranged in an extension direction of each of the peripheral signal wiring traces and extending through the second insulation layer; the third metal layer is formed at a location corresponding to each of the metal wiring traces and is electrically connected, through the vias, with each of the peripheral signal wiring traces.

The plurality of peripheral signal wiring traces comprises high level direct-current (DC) signal lines, low level DC signal lines, and clock signal lines of a gate-driver-on-array (GOA) circuit and grounding lines of the TFT substrate.

The first insulation layer comprises, stacked from bottom to top, a buffer layer, a gate insulation layer, and an interlayer dielectric layer.

The second insulation layer comprises, stacked from bottom to top, a planarization layer and a top insulation layer.

A first metal layer is arranged between the interlayer dielectric layer and the gate insulation layer.

The present invention also provides a manufacturing method of a TFT substrate, which comprises the following steps:

step 1, providing a backing plate, forming a first insulation layer on the backing plate, depositing and patterning a second metal layer on the first insulation layer, and forming a second insulation layer on the second metal layer, wherein the second metal layer comprises a plurality of peripheral signal wiring traces;

step 2, forming, in the second insulation layer at locations corresponding to each of the peripheral signal wiring traces, a plurality of vias that is arranged in an extension direction of each of the peripheral signal wiring traces and extends through the second insulation layer;

step 3, depositing and patterning a third metal layer on the second insulation layer such that the third metal layer is formed at a location corresponding to each of the peripheral signal wiring traces and is electrically connected, through the plurality of vias, with each of the peripheral signal wiring traces; and step 4, depositing a third insulation layer on the second insulation layer and the third metal layer to complete the manufacture of the TFT substrate.

The plurality of peripheral signal wiring traces comprises high level DC signal lines, low level DC signal lines, and clock signal lines of a GOA circuit and grounding lines of the TFT substrate.

In step 1, the first insulation layer comprises, stacked from bottom to top, a buffer layer, a gate insulation layer, and an interlayer dielectric layer.

In step 1, the second insulation layer comprises, stacked from bottom to top, a planarization layer and a top insulation layer.

Step 1 further comprises forming a first metal layer between the interlayer dielectric layer and the gate insulation layer.

The efficacy of the present invention is that the present invention provides a TFT substrate, which comprises a plurality of vias formed in a second insulation layer that is formed on a second metal layer that forms peripheral signal wiring traces of the TFT substrate so as to line up in an extension direction of each of the peripheral signal wiring traces and a third metal layer that is formed on the second insulation layer at a location corresponding to each of the peripheral signal wiring traces such that the third metal layer is connected, through the vias, with each of the peripheral signal wiring traces to thereby reduce the electrical resistance of each of the peripheral signal wiring traces and thus lowering down power consumption of control ICs and improving capability of the TFT substrate for resisting electrostatic discharge, allowing the TFT substrate to be used in high PPI liquid crystal displays and slim bezel liquid crystal displays. The present invention also provides a manufacturing method of the TFT substrate, which helps reduce the electrical resistance of each of peripheral signal wiring traces, lower down power consumption of control ICs, and improve the capability of the TFT substrate for resisting electrostatic discharge.

BRIEF DESCRIPTION OF THE DRAWINGS

The features and technical contents of the present invention will be better understood by referring to the following detailed description and drawings the present invention. However, the drawings are provided for the purpose of reference and illustration and are not intended to limit the scope of the present invention. In the drawing.

DETAILED DESCRIPTION OF THE PREFERRED EMBODIMENTS

To further expound the technical solution adopted in the present invention and the advantages thereof, a detailed description is given to a preferred embodiment of the present invention with reference to the attached drawings.

Figure 1:
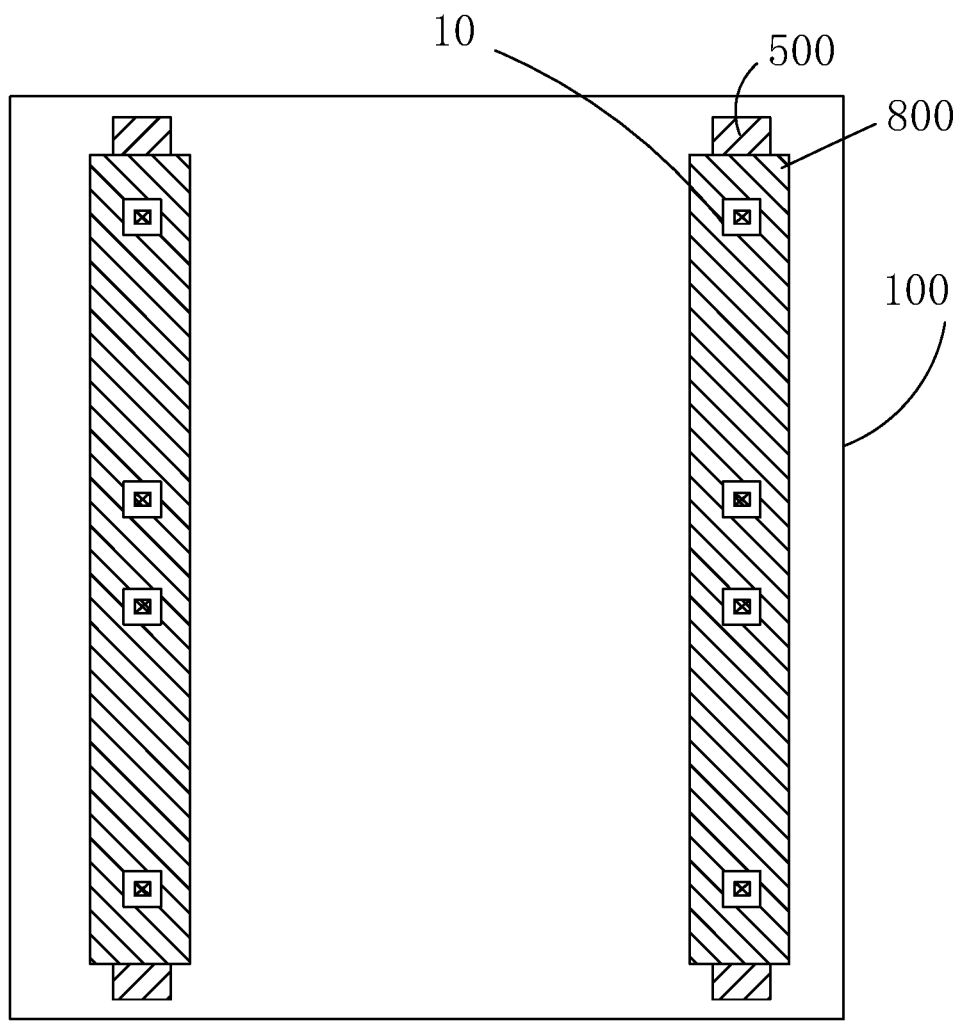
FIG. 1 is a schematic top plan view illustrating a thin-film transistor (TFT) substrate according to the present invention.
Figure 2:
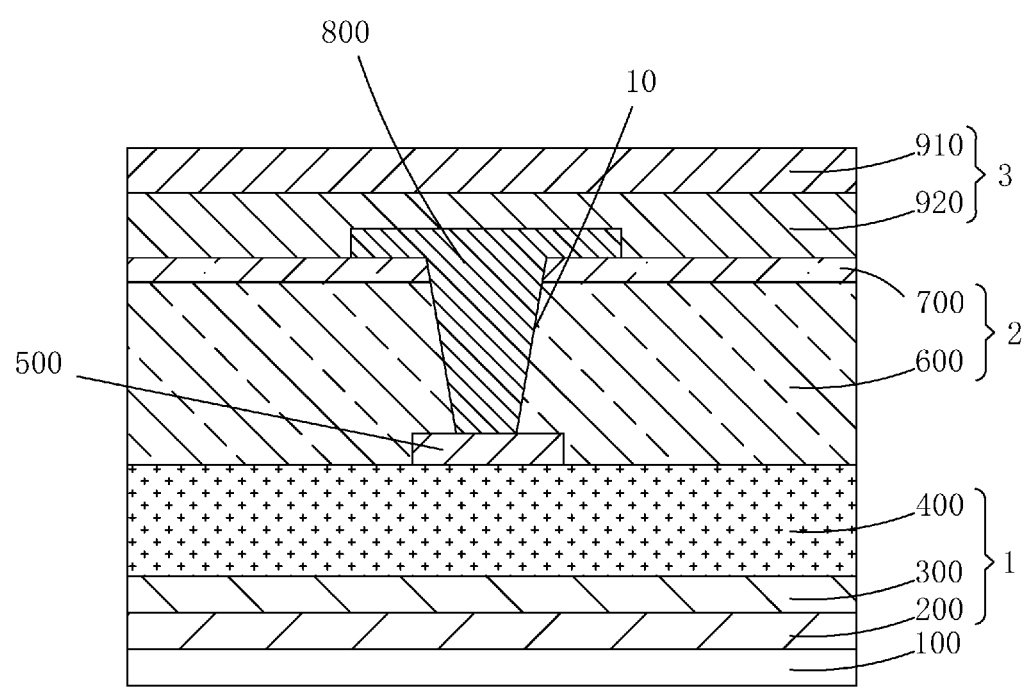
FIG. 2 is a schematic cross-sectional view illustrating the TFT substrate according to the present invention.
Figure 3:
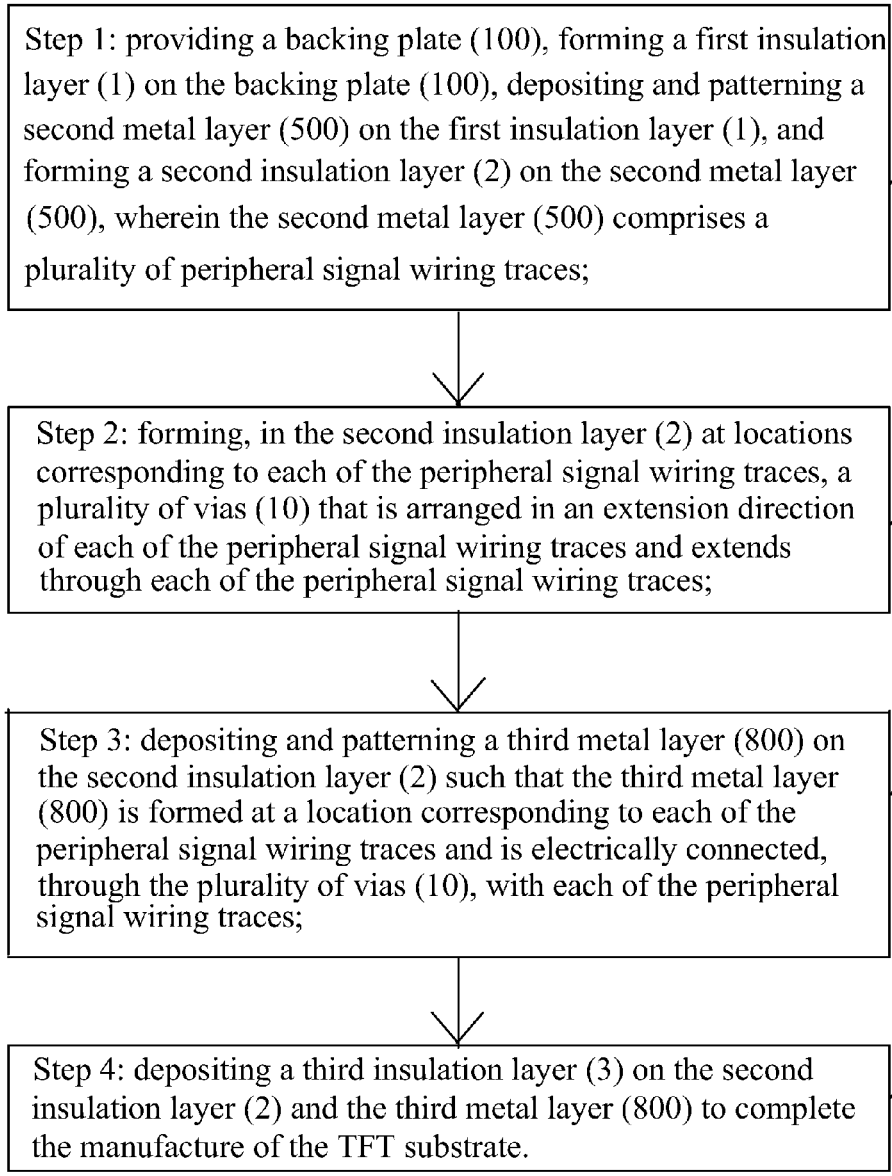
FIG. 3 is a flow chart illustrating a manufacturing method of a TFT substrate according to the present invention.

Referring to FIGS. 1-3, the present invention provides a thin-film transistor (TFT) substrate. The TFT substrate is a gate-driver-on-array (GOA) technology based TFT substrate of an in-cell touch display panel that comprises: a backing plate 100, a first insulation layer 1 arranged on the backing plate 100, a second metal layer 500 arranged on the first insulation layer 1, a second insulation layer 2 set on and covering the second metal layer 500 and the first insulation layer 1, a third metal layer 800 arranged on the second insulation layer 2, and a third insulation layer 3 set on and covering the third metal layer 800 and the second insulation layer 2.

The second metal layer 500 comprises a plurality of peripheral signal wiring traces. The second insulation layer 2 is formed, at locations above and corresponding to each of the peripheral signal wiring traces, with a plurality of vias 10 that is arranged in an extension direction of each of the peripheral signal wiring traces and extends through he second insulation layer. The third metal layer 800 is formed at a location corresponding to each of the metal wiring traces and is electrically connected, through the vias 10, with each of the peripheral signal wiring traces.

Specifically, the plurality of peripheral signal wiring traces comprises: high level direct-current (DC) signal lines, low level DC signal lines, and clock signal lines of a GOA circuit and grounding lines of the TFT substrate, wherein the high level DC signal lines, the low level DC signal lines, and the clock signal lines of the GOA circuit function to control the GOA circuit to conduct a row scanning operation for driving a display panel and these peripheral signal wiring traces may each be provided as a number of lines corresponding requirements. The arrangement of the third metal layer 800 on the high level DC signal lines, the low level DC signal lines, and the clock signal lines CK can effectively lower down electrical resistances of the high level DC signal lines, the low level DC signal lines, and the clock signal lines in order to reduce power consumption of control integrated circuits (ICs), reduces delay of scan control signals supplied from the GOA circuit, and improve a charging effect of pixels. The arrangement of the third metal layer 800 on the grounding lines helps effectively improve the capacity of the grounding lines for resisting electrostatic discharge (ESD).

Further, the first insulation layer 1 comprises, stacked from bottom to top, a buffer layer 200, a gate insulation layer 300, and an interlayer dielectric layer 400, wherein a light shielding layer is formed between the buffer layer 200 and the gate insulation layer 300 and a first metal layer is formed between the gate insulation layer 300 and the interlayer dielectric layer 400. The first metal layer is provided for forming gate terminals of TFTs of the TFT substrate and scan lines electrically connected with the gate terminals. The second metal layer 500, in addition to the plurality of peripheral signal lines, also forms source terminals and drain terminals of the TFTs of the TFT substrate and data lines that are electrically connected with the source terminals.

Further, the second insulation layer 2 comprises, stacked from bottom to top, a planarization layer 600 and a top insulation layer 700. The third insulation layer 3 comprises, stacked from bottom to top, a first passivation layer 910 and a second passivation layer 920. A bottom electrode of the display panel is formed between the planarization layer 600 and the top insulation layer 700. The third metal layer 800 also forms touch sensing electrodes so that the touch sensing electrodes and the third metal layer 800 located above each of the peripheral signal lines can be formed with one patterning process and the third metal layer 800 can be additionally provided above each of the peripheral signal lines without affecting the existing operation process and cell thickness.

The third insulation layer 3 comprises, stacked from bottom to top, the first passivation layer 910 and the second passivation layer 920, and a top electrode is additionally provided on the second passivation layer 920.

Specifically, the first insulation layer 1, the second insulation layer 2, and the third insulation layer 3 are each formed of a material comprising one or a combination of multiple ones of silicon oxide and silicon nitride.

Referring to FIG. 4, with additional reference to FIGS. 1-3, based on the above-described TFT substrate, the present invention also provides a manufacturing method of the TFT substrate, which comprises the following steps:

Step 1: providing a backing plate 100, forming a first insulation layer 1 on the backing plate 100, depositing and patterning a second metal layer 500 on the first insulation layer 1, and forming a second insulation layer 2 on the second metal layer 500.

The second metal layer 500 comprises a plurality of peripheral signal wiring traces.

Specifically, the first insulation layer 1 comprises, stacked from bottom to top, a buffer layer 200, a gate insulation layer 300, and an interlayer dielectric layer 400. The second insulation layer 2 comprises, stacked from bottom to top, a planarization layer 600 and a top insulation layer 700.

Further, Step 1 specifically comprises: first forming a buffer layer 200 on a backing plate 100, and next forming a light shielding layer on the buffer layer 200, then forming a gate insulation layer 300 on the light shielding layer and the buffer layer 200, afterwards forming a first metal layer on the gate insulation layer 300, then forming an interlayer dielectric layer 400 on the first metal layer, next forming a second metal layer 500 on the interlayer dielectric layer 400, then forming a planarization layer 600 on the second metal layer 500, then forming a bottom electrode on the planarization layer 600, and finally forming a top insulation layer 700 on the bottom electrode and the planarization layer 600.

Step 2: forming, in the second insulation layer 2 at locations corresponding to each of the peripheral signal wiring traces, a plurality of vias 10 that is arranged in an extension direction of each of the peripheral signal wiring traces and extends through the second insulation layer 2.

Specifically, the plurality of peripheral signal wiring traces comprises: high level DC signal lines, low level DC signal lines, and clock signal lines of a GOA circuit and grounding lines of the TFT substrate, wherein the high level DC signal lines, the low level DC signal lines, and the clock signal lines of the GOA circuit function to control the GOA circuit to conduct a row scanning operation for driving a display panel and these peripheral signal wiring traces may each be provided as a number of lines corresponding requirements.

Step 3: depositing and patterning a third metal layer 800 on the second insulation layer 2 such that the third metal layer 800 is formed at a location corresponding to each of the peripheral signal wiring traces and is electrically connected, through the plurality of vias 10, with each of the peripheral signal wiring traces.

Specifically, the third metal layer 800, in addition to being formed at a location corresponding to each of the peripheral signal wiring traces, forms touch sensing electrodes of an in-cell touch display panel so that the touch sensing electrodes and the third metal layer 800 located above each of the peripheral signal lines can be formed with one patterning process and the third metal layer 800 can be additionally provided above each of the peripheral signal lines without affecting the existing operation process and cell thickness. The arrangement of the third metal layer 800 on the high level DC signal lines, the low level DC signal lines, and the clock signal lines CK can effectively lower down electrical resistances of the high level DC signal lines, the low level DC signal lines, and the clock signal lines in order to reduce power consumption of control integrated circuits (ICs), reduces delay of scan control signals supplied from the GOA circuit, and improve a charging effect of pixels. The arrangement of the third metal layer 800 on the grounding lines helps effectively improve the capacity of the grounding lines for resisting electrostatic discharge (ESD).

Step 4: depositing a third insulation layer 3 on the second insulation layer 2 and the third metal layer 800 to complete the manufacture of the TFT substrate.

Specifically, the third insulation layer 3 comprises, stacked from bottom to top, a first passivation layer 910 and a second passivation layer 920, and additionally, the third insulation layer 3 is provided with a top electrode.

Specifically, the first insulation layer 1, the second insulation layer 2, and the third insulation layer 3 are each formed of a material comprising one or a combination of multiple ones of silicon oxide and silicon nitride.

In summary, the present invention provides a TFT substrate, which comprises a plurality of vias formed in a second insulation layer that is formed on a second metal layer that forms peripheral signal wiring traces of the TFT substrate so as to line up in an extension direction of each of the peripheral signal wiring traces and a third metal layer that is formed on the second insulation layer at a location corresponding to each of the peripheral signal wiring traces such that the third metal layer is connected, through the vias, with each of the peripheral signal wiring traces to thereby reduce the electrical resistance of each of the peripheral signal wiring traces and thus lowering down power consumption of control ICs and improving capability of the TFT substrate for resisting electrostatic discharge, allowing the TFT substrate to be used in high PPI liquid crystal displays and slim bezel liquid crystal displays. The present invention also provides a manufacturing method of the TFT substrate, which helps reduce the electrical resistance of each of peripheral signal wiring traces, lower down power consumption of control ICs, and improve the capability of the TFT substrate for resisting electrostatic discharge.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A thin-film transistor (TFT) substrate, comprising: a backing plate, a first insulation layer arranged on the backing plate, a second metal layer arranged on the first insulation layer, a second insulation layer set on and covering the second metal layer and the first insulation layer, a third metal layer arranged on the second insulation layer, and a third insulation layer set on and covering the third metal layer and the second insulation layer;

wherein the second metal layer comprises a plurality of peripheral signal wiring traces; the second insulation layer comprises, at locations above and corresponding to each of the peripheral signal wiring traces, a plurality of vias arranged in an extension direction of each of the peripheral signal wiring traces and extending through the second insulation layer; the third metal layer is formed at a location corresponding to each of the metal wiring traces and is electrically connected, through the vias, with each of the peripheral signal wiring traces;

wherein the plurality of peripheral signal wiring traces comprise high level direct-current (DC) signal lines, low level DC signal lines, and clock signal lines of a gate-driver-on-array (GOA) circuit and grounding lines of the TFT substrate and wherein the plurality of vias are formed through the second insulation layer as being distributed along each of the peripheral signal wiring traces.

2. The TFT substrate as claimed in claim 1, wherein the first insulation layer comprises, stacked from bottom to top, a buffer layer, a gate insulation layer, and an interlayer dielectric layer.

3. The TFT substrate as claimed in claim 1, wherein the second insulation layer comprises, stacked from bottom to top, a planarization layer and a top insulation layer.

4. The TFT substrate as claimed in claim 2, wherein a first metal layer is arranged between the interlayer dielectric layer and the gate insulation layer.

* * * * *